(12) United States Patent
Tu et al.

(10) Patent No.: US 11,168,169 B2
(45) Date of Patent: Nov. 9, 2021

(54) ALLYL-CONTAINING RESIN AND USES OF THE SAME

(71) Applicant: CHANG CHUN PLASTICS CO., LTD., Taipei (TW)

(72) Inventors: An-Pang Tu, Taipei (TW); Shih-De Yang, Taipei (TW); Ping-Chieh Wang, Taipei (TW)

(73) Assignee: CHANG CHUN PLASTICS CO., LTD., Taipei (TW)

( * ) Notice: Subject to any disclaimer, the term of this patent is extended or adjusted under 35 U.S.C. 154(b) by 0 days.

(21) Appl. No.: 16/988,371

(22) Filed: Aug. 7, 2020

(65) Prior Publication Data

US 2021/0230335 A1 Jul. 29, 2021

Related U.S. Application Data

(60) Provisional application No. 62/884,812, filed on Aug. 9, 2019.

(51) Int. Cl.
| | | |
|---|---|---|
| *C08F 283/04* | (2006.01) | |
| *C08J 5/24* | (2006.01) | |
| *C08G 61/10* | (2006.01) | |
| *C08G 65/48* | (2006.01) | |
| *H05K 1/03* | (2006.01) | |

(52) U.S. Cl.
CPC .......... *C08F 283/04* (2013.01); *C08G 61/10* (2013.01); *C08G 65/485* (2013.01); *C08J 5/244* (2021.05); *H05K 1/0373* (2013.01); *C08J 2371/12* (2013.01); *C08J 2379/08* (2013.01); *C08J 2471/12* (2013.01); *C08J 2479/08* (2013.01)

(58) Field of Classification Search
CPC ........ G03F 7/012; G03F 7/016; G03F 7/0163; G03F 7/0166; G03F 7/021; G03F 7/0212; G03F 7/0215; G03F 7/0217; G03F 7/022; G03F 7/0223; G03F 7/0226; G03F 7/023; G03F 7/0233; G03F 7/0236; G03F 7/025; G03F 7/027; G03F 7/0275; G03F 7/028; G03F 7/0285; G03F 7/029; G03F 7/0295; G03F 7/031; G03F 7/032; G03F 7/0325; G03F 7/033; G03F 7/035; G03F 7/037; G03F 7/038; G03F 7/0381; G03F 7/0382; G03F 7/0384; G03F 7/0385; G03F 7/0387; G03F 7/0388; G03F 7/039; G03F 7/0392; G03F 7/0395; G03F 7/0397; G03F 7/085; C08J 2425/00; C08J 2425/02; C08J 2425/04; C08J 2425/06; C08J 2425/08; C08J 2425/10; C08J 2425/12; C08J 2425/14; C08J 2425/16; C08J 2425/18; C08J 2471/12; C08J 2371/12; C08J 2379/08; C08J 2479/08; H05K 1/0373
See application file for complete search history.

(56) References Cited

U.S. PATENT DOCUMENTS

| | | | | |
|---|---|---|---|---|
| 5,494,773 A | * | 2/1996 | Tan | ........................ G03F 7/0236 430/165 |
| 6,803,171 B2 | | 10/2004 | Gronbeck et al. | |
| 2006/0079605 A1 | | 4/2006 | Sato et al. | |

FOREIGN PATENT DOCUMENTS

| | | |
|---|---|---|
| CN | 104388099 A | 3/2015 |
| TW | 594416 B | 6/2004 |
| TW | 200427734 A | 12/2004 |

OTHER PUBLICATIONS

TW Office Action for corresponding TW Application No. 109125902, dated Feb. 19, 2021.

\* cited by examiner

*Primary Examiner* — Christopher M Rodd
(74) *Attorney, Agent, or Firm* — Cantor Colburn LLP

(57) ABSTRACT

An allyl-containing resin is provided. The allyl-containing resin comprises a repeating unit comprising a structural unit represented by the following formula (I):

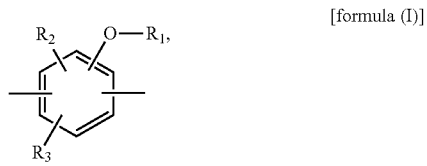

[formula (I)]

wherein, $R_1$ to $R_3$ in formula (I) are as defined in the specification; the Fourier transform infrared spectrum of the allyl-containing resin has a signal intensity "a" from 1650 cm$^{-1}$ to 1630 cm$^{-1}$ and a signal intensity "b" from 1620 cm$^{-1}$ to 1560 cm$^{-1}$, and 0<a/b≤1.20; and the quantitative $^1$H-NMR spectrum of the allyl-containing resin has a signal intensity "c" from 3.2 ppm to 6.2 ppm and a signal intensity "d" from 6.6 ppm to 7.4 ppm, and 0<c/d≤1.20.

10 Claims, No Drawings

ALLYL-CONTAINING RESIN AND USES OF THE SAME

CROSS-REFERENCE TO RELATED APPLICATIONS

The present invention claims priority under 35 U.S.C. § 119 to U.S. Provisional Patent Application No. 62/884,812 filed on Aug. 9, 2019, the entire content of which is incorporated herein by reference.

FIELD OF THE INVENTION

The present invention relates to an allyl-containing resin, and particularly relates to an allyl-containing resin with low dielectric dissipation and its application in printed circuit boards.

BACKGROUND OF THE INVENTION

As applications of electronic products have been developed toward the trends of high-frequency and high-speed signal transmission, miniaturization of electronic components, and high-density wiring of printed circuit boards, the requirements for the physical and chemical properties of electronic materials have also increased. In particular, in high-frequency transmission applications, the use of low dielectric dissipation materials have become an inevitable trend. As such, it is difficult for traditional dielectric materials with epoxy resin as the main component to meet the demand.

The dielectric dissipation factor ($D_f$) of fluoro-based resin, such as polytetrafluoroethene, may be as low as 0.0004, but processing is difficult and the cost is high, so its applications are limited. The $D_f$ of polyphenylene ether resin may reach the level of 0.0007, but it has disadvantages of being difficult to process and a low glass transition temperature (Tg). Bismaleimide resin has excellent dielectric properties, heat resistance and reactivity, and has the advantage of no by-products after self-polymerization, and may be further modified by, for example, diallyl bisphenol A (DABPA) to improve the solubility and toughness thereof.

SUMMARY OF THE INVENTION

The present invention aims to provide an allyl-containing resin, which has excellent dielectric properties and is especially suitable for the modification of bismaleimide resin. The allyl-containing resin increases the operable range of bismaleimide resin, while maintaining the advantage of high heat resistance of bismaleimide resin. In particular, it may reduce the dielectric dissipation factor ($D_f$) and dielectric constant ($D_k$) of bismaleimide resin, thereby making the resultant electronic material especially suitable for high-frequency transmission applications. Therefore, the present invention relates to the following objectives.

An objective of the present invention is to provide an allyl-containing resin which comprises a repeating unit, and the repeating unit comprises a first structural unit represented by the following formula (I):

[formula (I)]

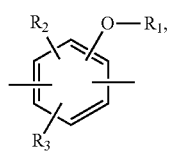

wherein, in formula (I), $R_1$ and $R_2$ are each independently H or allyl, with the proviso that at least one of $R_1$ and $R_2$ is allyl; and $R_3$ is H, a $C_1$ to $C_{21}$ hydrocarbyl, or a $C_1$ to $C_{21}$ hydroxyl-containing group;

the Fourier transform infrared spectrum of the allyl-containing resin has a signal intensity a ranging from 1650 cm$^{-1}$ to 1630 cm$^{-1}$ and a signal intensity b ranging from 1620 cm$^{-1}$ to 1560 cm$^{-1}$, and 0<a/b≤1.20; and the quantitative $^1$H-NMR spectrum of the allyl-containing resin has a signal intensity c ranging from 3.2 ppm to 6.2 ppm and a signal intensity d ranging from 6.6 ppm to 7.4 ppm, and 0<c/d≤1.20.

In some embodiments of the present invention, the Fourier transform infrared spectrum is determined as follows: coating the allyl-containing resin on a KBr pellet using a film method; and characterizing the absorption spectrum of the KBr pellet by using a Fourier transform infrared spectrometer under the following conditions: a scan count of 16, a scan range of 4000 cm$^{-1}$ to 400 cm$^{-1}$, and a resolution of 1 cm$^{-1}$; and determining the signal intensity a and signal intensity b using attenuated total reflectance (ATR), wherein the signal intensities are the absorbance values (arbitrary units) within the respective designated wavelength ranges.

In some embodiments of the present invention, the quantitative $^1$H-NMR spectrum is determined by a nuclear magnetic resonance spectrometer by using deuterated chloroform as a solvent and tetramethylsilane as a reference material under the following conditions: a resonance frequency of 500 MHz, a pulse width of 10 μs, a pulse delay of 2 s, a scan count of 32, and a chemical shift of the reference material of 0 ppm.

In some embodiments of the present invention, 0.10≤a/b≤1.20 and 0.50≤c/d≤1.20.

In some embodiments of the present invention, the repeating unit further comprises one or more second structural units selected from the group consisting of —CH$_2$—, —C$_2$H$_4$—, —C$_2$H$_2$—, —C$_2$—, —C$_3$H$_6$—, —C$_3$H$_4$—, —C$_3$H$_2$—, —C$_4$H$_8$—, —C$_4$H$_6$—, —C$_4$H$_4$—, —C$_5$H$_{10}$—, —C$_5$H$_8$—, —C$_5$H$_6$—, —C$_6$H$_{12}$—, —C$_6$H$_{10}$—, —C$_6$H$_8$—, —C$_7$H$_{14}$—, —C$_7$H$_{12}$—, —C$_7$H$_{10}$—, —C$_8$H$_{16}$—, —C$_8$H$_{14}$-, —C$_8$H$_{12}$—, —C$_9$H$_{18}$—, —C$_9$H$_{16}$—, —C$_9$H$_{14}$—, —C$_{10}$H$_{20}$—, —C$_{10}$H$_{18}$—, —C$_{10}$H$_{16}$—,

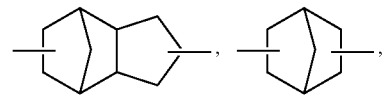

carbonyl, sulfuryl, and —O—.

Another objective of the present invention is to provide a bismaleimide resin, which is modified by the allyl-containing resin described above.

Yet another objective of the present invention is to provide a resin composition, which comprises the bismaleimide resin described above.

A further objective of the present invention is to provide a prepreg, which is prepared by impregnating a substrate with the resin composition described above or by coating the resin composition described above onto a substrate, and drying the impregnated or coated substrate.

Yet another objective of the present invention is to provide a metal-clad laminate, which is prepared by laminating the prepreg described above with a metal foil.

Yet another objective of the present invention is to provide a printed circuit board, which is prepared from the metal-clad laminate described above.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to those described in the specification.

Unless otherwise stated, the terms "a," "the," or the like recited in the specification (especially in the claims) should include both the singular and the plural forms.

Unless otherwise stated, the terms "first," "second," or the like recited in the specification (especially in the claims) are only used to distinguish different elements or components. They do not have special meanings and are not intended to indicate sequential order.

As used herein, "operable range" refers to the temperature range from the softening point of resin to the thermal crosslinking temperature.

As used herein, the term "terminal hydroxyl group" refers to the terminal hydroxyl group (—OH) attached to the polymer backbone.

1. Allyl-Containing Resin

The present invention provide an allyl-containing resin, which has low viscosity, low softening point and excellent dielectric properties, and may be used to modify bismaleimide resin so that the bismaleimide resin has a wide operating temperature range (i.e., operable range) and maintains excellent dielectric properties and high heat resistance.

1.1. Properties of Allyl-Containing Resin

The allyl-containing resin of the present invention has a signal intensity a from 1650 cm$^{-1}$ to 1630 cm$^{-1}$ and a signal intensity b from 1620 cm$^{-1}$ to 1560 cm$^{-1}$ when measured by Fourier transform infrared spectroscopy (FT-IR), and the ratio (a/b) of the signal intensity a to the signal intensity b is greater than 0 to 1.20, i.e., 0<a/b≤1.20. For example, a/b may be 0.125, 0.15, 0.175, 0.20, 0.225, 0.25, 0.275, 0.30, 0.325, 0.35, 0.375, 0.40, 0.425, 0.45, 0.475, 0.50, 0.525, 0.55, 0.575, 0.60, 0.625, 0.65, 0.675, 0.70, 0.725, 0.75, 0.775, 0.80, 0.825, 0.85, 0.875, 0.90, 0.925, 0.95, 0.975, 1.00, 1.025, 1.05, 1.075, 1.10, 1.125, 1.15 or 1.175, or within a range constituted by any two values described above. In some embodiments of the present invention, the ratio (a/b) of the signal intensity a to the signal intensity b is 0.10 to 1.20 (i.e., 0.10≤a/b≤1.20), preferably 0.19 to 1.18 (i.e., 0.19≤a/b≤1.18). The allyl-containing resin may have excellent dielectric properties (low $D_k$ and low $D_f$) when the a/b value of the allyl-containing resin is within the specified range of the present invention.

The FT-IR measurement of the allyl-containing resin of the present invention may be obtained by using a Fourier transform infrared spectrometer as follows: coating 1 mg of allyl-containing resin on a KBr pellet with a diameter of 13 mm and a thickness of 0.5 mm to form a film with a thickness of 0.02 μm by a film method, placing the coated KBr pellet in a pellet holder and then placing the pellet holder in a Fourier transform infrared spectrometer and measuring the coated absorption spectrum of the KBr pellet under the following conditions: a scan count of 16, a scan range of 4000 cm$^{-1}$ to 400 cm$^{-1}$, and a resolution of 1 cm$^{-1}$, and determining the signal intensity a and signal intensity b using attenuated total reflectance (ATR), wherein the signal intensities are the absorbance values within the respective designated wavelength ranges, and each of them is calculated from the integral area of the connecting line between the starting point and the ending point of the peak in each designated range.

The $^1$H-NMR spectrum of the allyl-containing resin of the present invention as determined by quantitative NMR ($_q$NMR) has a signal intensity c from 3.2 ppm to 6.2 ppm and a signal intensity d from 6.6 ppm to 7.4 ppm, and the ratio (c/d) of the signal intensity c to the signal intensity d is greater than 0 to 1.20, i.e., 0<c/d≤1.20. In some embodiments of the present invention, the ratio (c/d) of the signal intensity c to the signal intensity d is 0.50 to 1.20 (i.e., 0.50≤c/d≤1.20), preferably 0.93 to 1.15 (i.e., 0.93≤c/d≤1.15). For example, c/d may be 0.10, 0.125, 0.15, 0.175, 0.20, 0.225, 0.25, 0.275, 0.30, 0.325, 0.35, 0.375, 0.40, 0.425, 0.45, 0.475, 0.50, 0.525, 0.55, 0.575, 0.60, 0.625, 0.65, 0.675, 0.70, 0.725, 0.75, 0.775, 0.80, 0.825, 0.85, 0.875, 0.90, 0.925, 0.95, 0.975, 1.00, 1.025, 1.05, 1.075, 1.10, 1.125, 1.15 or 1.175, or within a range constituted by any two values described above. Excellent dielectric properties (low $D_k$ and low $D_f$) can be provided when the c/d value of the allyl-containing resin is within the specified range of the present invention.

The $^1$H-NMR spectrum of the allyl-containing resin of the present invention may be measured by a nuclear magnetic resonance spectrometer under the following conditions: dissolving 15 mg of allyl-containing resin in 750 μl of deuterated chloroform, placing the resultant solution in a sample feeder of the nuclear magnetic resonance spectrometer (e.g., Bruker AVANCE 500 NMR), and after a shimming step, performing analysis using a 5 mm probe (e.g., a BBFO Smart probe), in which tetramethylsilane is used as a reference material, the resonance frequency is 500 MHz, the pulse width is 10 μs, the pulse delay time is 2 seconds, the scan count is 32, and the chemical shift of the reference material is set to 0 ppm.

1.2. Structure of Allyl-Containing Resin

The allyl-containing resin of the present invention has a repeating unit which comprises a first structural unit represented by the following formula (I), and the allyl-containing resin of the present invention may have terminal groups selected from hydroxyl and allyl, and each of the terminal groups may be the same or different

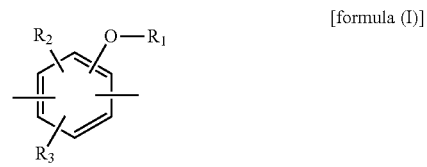

[formula (I)]

In formula (I), $R_1$ and $R_2$ are each independently H or allyl, with the proviso that at least one of $R_1$ and $R_2$ is allyl, $R_3$ is H, a $C_1$ to $C_{21}$ hydrocarbyl, or a $C_1$ to $C_{21}$ hydroxyl-containing group. The $C_1$ to $C_{21}$ hydrocarbyl includes, but is not limited to, a $C_1$ to $C_{21}$ alkyl, a $C_2$ to $C_{21}$ alkenyl, and a $C_2$ to $C_{21}$ alkynyl, and the $C_1$ to $C_{21}$ hydrocarbyl may have a linear, branched or cyclic structure. The $C_1$ to $C_{21}$ hydroxyl-containing group includes, but is not limited to, a $C_1$ to $C_{21}$ hydroxyalkyl.

Examples of $C_1$ to $C_{21}$ alkyl include, but are not limited to, methyl, ethyl, n-propyl, isopropyl, n-butyl, isobutyl, tertiary butyl, n-pentyl, isopentyl, tertiary pentyl, neopentyl, n-hexyl, isohexyl, n-heptyl, isoheptyl, n-octyl, isooctyl, n-nonyl, isononyl, n-decyl, isodecyl, undecyl, dodecyl, pentadecyl, and eicosyl. Examples of $C_2$ to $C_{21}$ alkenyl include, but are not limited to, vinyl, propenyl, allyl, n-butenyl, isobutenyl, pentenyl, hexenyl, heptenyl, octenyl, nonenyl, and decenyl. Examples of $C_2$ to $C_{21}$ alkynyl include, but are not limited to, ethynyl, propynyl, butynyl, pentynyl, hexynyl, heptynyl, octynyl, nonynyl, and decynyl. Examples of $C_1$ to $C_{21}$ hydroxyalkyl include, but are not limited to, hydroxymethyl, hydroxyethyl, hydroxypropyl, hydroxybutyl, hydroxypentyl, and hydroxyhexyl.

In an embodiment of the present invention, $R_1$ in formula (I) is allyl and $R_2$ is H. In another embodiment of the present invention, $R_1$ in formula (I) is H and $R_2$ is allyl.

In an embodiment of the present invention, $R_3$ in the formula (I) is selected from the group consisting of: $-CH_3$, $-CH_2OH$, $-C_2H_5$, $-C_2H_3$, $-C_2H_4OH-$, $-C_2H$, $-C_3H_7$, $-C_3H_5$, $-C_3H_3$, $-C_4H_9$, $-C_4H_7$, $-C_4H_5$, $-C_4H_8OH$, $-C_5H_{11}$, $-C_5H_9$, $-C_5H_7$, $-C_6H_{13}$, $-C_6H_{11}$, $-C_6H_9$, $-C_7H_{15}$, $-C_7H_{13}$, $-C_7H_{11}$, $-C_8H_{17}$, $-C_8H_{15}$, $-C_8H_{13}$, $-C_8H_{14}OH$, $-C_9H_{19}$, $-C_9H_{17}$, $-C_9H_{15}$, $-C_{10}H_{21}$, $-C_{10}H_{19}$, $-C_{10}H_{17}$, $-C_{11}H_{23}$, $-C_{11}H_{21}-$, $-C_{11}H_{19}$, $-C_{12}H_{25}$, $-C_{12}H_{23}$, $-C_{12}H_{21}$, $-C_{13}H_{27}$, $-C_{13}H_{25}$, $-C_{13}H_{23}$, $-C_{14}H_{29}$, $-C_{14}H_{27}$, $-C_{14}H_{25}$, $-C_{15}H_{31}$, $-C_{15}H_{29}$, $-C_{15}H_{27}$, $-C_{16}H_{33}$, $-C_{16}H_{31}$, $-C_{16}H_{29}$, $-C_{17}H_{35}$, $-C_{17}H_{33}$, $-C_{17}H_{31}$, $-C_{18}H_{37}$, $-C_{18}H_{35}$, $-C_{12}H_{18}OH$, $-C_{17}H_{33}$, $-C_{19}H_{39}$, $-C_{19}H_{37}$, $-C_{19}H_{35}$, $-C_{20}H_{41}$, $-C_{20}C_{39}$, $-C_{20}H_{37}$, $-C_{21}H_{43}$, $-C_{21}H_{41}$, $-C_{21}H_{34}OH$, $-C_{21}H_{32}OH$, $-C_{21}H_{30}OH$, and $-C_{21}H_{28}OH$.

In an embodiment of the present invention, $R_3$ in formula (I) has a structure represented by the following formula (i), wherein $R_4$ is $-C_{15}H_{25}$, $-C_{15}H_{27}$, $-C_{15}H_{29}$ and $-C_{15}H_{31}$.

[formula (i)]

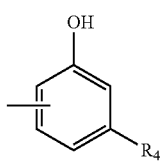

In an embodiment of the present invention, the repeating unit of the allyl-containing resin of the present invention further comprises one or more structural units of linear or branched alkylene, linear or branched alkenylene, divalent fused ring group and divalent bridged bicyclic group. More specifically, the repeating unit of the allyl-containing resin of the present invention further comprises one or more second structural units selected from the group consisting of: $-CH_2-$, $-C_2H_4-$, $-C_2H_2-$, $-C_2-$, $-C_3H_6-$, $-C_3H_4-$, $-C_3H_2-$, $-C_4H_8-$, $-C_4H_6-$, $-C_4H_4-$, $-C_5H_{10}-$, $-C_5H_8-$, $-C_5H_6-$, $-C_6H_{12}-$, $-C_6H_{10}-$, $-C_6H_8-$, $-C_7H_{14}-$, $-C_7H_{12}-$, $-C_7H_{10}-$, $-C_8H_{16}-$, $-C_8H_{14}-$, $-C_8H_{12}-$, $-C_9H_{18}-$, $-C_9H_{16}-$, $-C_9H_{14}-$, $-C_{10}H_{20}-$, $-C_{10}H_{18}-$, $-C_{10}H_{16}-$,

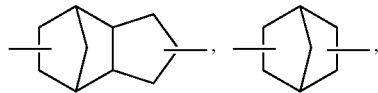

carbonyl, sulfuryl, and $-O-$.

In an embodiment of the present invention, the repeating unit of the allyl-containing resin of the present invention comprises a first structural unit and a second structural unit, and the first structural unit is adjacent to the second structural unit. In another embodiment of the present invention, the repeating unit of the allyl-containing resin of the present invention is composed of a first structural unit and a second structural unit.

2. Modified Bismaleimide Resin

The allyl-containing resin of the present invention may be used for modifying bismaleimide resin, so that the bismaleimide resin further has excellent dielectric properties, especially low dielectric dissipation property, and has a wide operating temperature range (i.e., a wide operable range) while maintaining the advantage of high heat resistance. Therefore, the present invention also provides a bismaleimide resin which is modified by the allyl-containing resin described above.

In an embodiment of the present invention, the bismaleimide resin has a structure represented by the following formula (II):

[formula (II)]

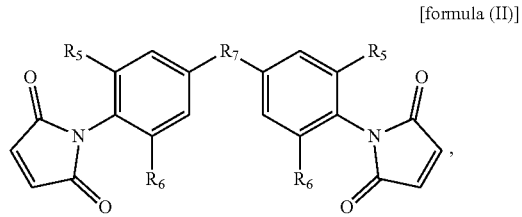

wherein $R_5$ and $R_6$ are each independently H, $-CH_3$ or $-C_2H_5$, $R_7$ is $-CH_2-$, $-O-$, $-C_3H_6-$, $-SO_2-$

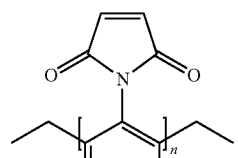

or

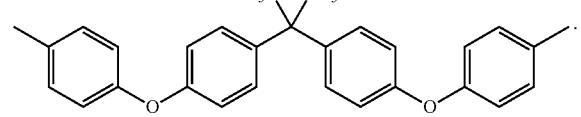

Examples of bismaleimide resin having the structure represented by the formula (II) include, but are not limited to, 4,4'-diphenylmethane bismaleimide, 4,4'-diphenyl ether bismaleimide, 4,4'-diphenylisopropyl bismaleimide, and 4,4'-diphenyl sulfone bismaleimide.

The modification of bismaleimide resin is carried out by addition polymerization reaction with allyl-containing resin, and the polymerization conditions are not particularly limited as long as the double bond of bismaleimide resin may react with the double bond of allyl-containing resin. Generally speaking, the temperature of the polymerization reaction may be 110° C. to 250° C., such as 115° C., 120° C., 125° C., 130° C., 135° C., 140° C., 145° C., 150° C., 155° C., 160° C., 165° C., 170° C., 175° C., 180° C., 185° C., 190° C., 195° C., 200° C., 205° C., 210° C., 215° C., 220° C., 225° C., 230° C., 235° C., 240° C. or 245° C., or within a range constituted by any two values described above. The reaction time of the polymerization reaction may be 10 minutes to 10 hours.

The polymerization reaction of allyl-containing resin and bismaleimide resin may optionally be carried out in the presence of catalysts, the catalysts include, but are not limited to, tertiary phosphine, triaryl phosphine, trialkyl phosphine, triphenyl phosphine, trimethyl phosphine, tri-n-butyl phosphine and tricyclohexyl phosphine, and these catalysts may be used alone or in any combination. The amount of the catalyst is not particularly limited, and generally, it may be 0 wt % to 5 wt % based on the total weight of the allyl-containing resin and the bismaleimide resin.

The reaction ratio of allyl-containing resin and bismaleimide resin may be 1:2 to 2:1, preferably 1:1.5 to 1.5:1, more preferably 1:0.9 to 1:1.3, as calculated by the number of double bond equivalents. When the reaction ratio of allyl-containing resin and bismaleimide resin is within the above range, the modified bismaleimide resin may have a wide operating temperature range (i.e., operable range) and maintain excellent heat resistance (high $T_g$) and dielectric properties (low $D_k$ and low $D_f$).

3. Resin Composition

The modified bismaleimide resin of the present invention has a wide operating temperature range (i.e., operable range), and maintains excellent dielectric properties and high heat resistance. Therefore, the present invention further provides a resin composition, which comprises the modified bismaleimide resin as described above, and the cured product thereof obtained after heat curing may be used as a dielectric material in printed circuit boards.

The resin composition of the present invention may optionally further comprise other optional components, such as other thermosetting resin components, crosslinking agents, flame retardants, fillers and additives known in the art, so as to adaptively improve the processability of the resin composition during the manufacturing process, or to improve the physical and chemical properties of materials made from the resin composition. Examples of other thermosetting resin components include, but are not limited to, polyphenylene ether resin and epoxy resin. Additives known in the art include, but are not limited to, polymerization initiators, such as organic peroxides and azo compounds.

The crosslinking agent refers to a component which has unsaturated groups and may cross-link with thermosetting resins (such as polyphenylene ether resin and bismaleimide resin) to form a three-dimensional network structure. Crosslinking agents include, but are not limited to, multifunctional allyl compounds, multifunctional acrylates, multifunctional acrylamides, and multifunctional styrenic compounds. Examples of multifunctional allyl compounds include triallyl isocyanurate (TAIC) and triallyl cyanurate (TAC). Examples of multifunctional acrylates include trimethylolpropane tri(meth)acrylate. Examples of multifunctional styrenic compounds include 1,3-divinylbenzene and 1,4-divinylbenzene. Each of the crosslinking agents may be used alone or in any combination.

The flame retardant may increase the heat resistance and flame retardancy of the electronic materials prepared from the resin composition. The flame retardants include, but are not limited to, phosphorus-containing flame retardants, bromine-containing flame retardants, and nitrogen-containing compounds, and various types of flame retardants may be used alone or in any combination. Examples of phosphorus-containing flame retardants include, but are not limited to, phosphate ester and phosphazene. Examples of bromine-containing flame retardants include, but are not limited to, tetrabromobisphenol A, decabromodiphenyl oxide, and decabrominated diphenyl ethane. Examples of nitrogen-containing compounds include, but are not limited to, melamine and derivatives thereof.

The filler may improve the mechanical strength, thermal conductivity and dimensional stability of the electronic material prepared from the resin composition. Examples of suitable fillers include, but are not limited to, fillers selected from the group consisting of: silicon dioxide, magnesium oxide, magnesium hydroxide, calcium carbonate, talc, clay, aluminum nitride, aluminum oxide, aluminum hydroxide, boron nitride, silicon nitride, aluminum silicon carbide, silicon carbide, sodium carbonate, magnesium carbonate, titanium dioxide, zinc oxide, zirconium oxide, quartz, diamond powder, diamond-like powder, graphite, calcined kaolin, pryan, mica, hydrotalcite, PTFE powder, glass beads, ceramic whiskers, carbon nanotubes, nanoscale inorganic powder and combinations thereof.

With regard to the preparation of the resin composition of the present invention, each component of the resin composition, including bismaleimide resin and other optional components, may be uniformly mixed with a stirrer and dissolved or dispersed in a solvent to be made into a varnish-like form for subsequent processing and utilization. The solvent may be any inert solvent that may dissolve or disperse the components of the resin composition but does not react with the components. For example, solvents that may be used to dissolve or disperse the components of the resin composition include, but are not limited to, toluene, γ-butyrolactone, methyl ethyl ketone, cyclohexanone, butanone, acetone, xylene, methyl isobutyl ketone, N,N-dimethyl formamide (DMF), N,N-dimethyl acetamide (DMAc) and N-methyl-pyrolidone (NMP). Each solvent may be used alone or in combination. The amount of the solvent is not particularly limited, and in principle, it may be used as long as the components of the resin composition are uniformly dissolved or dispersed therein. In the attached embodiments, methyl ethyl ketone was used as the solvent.

4. Prepreg

The present invention also provides a prepreg prepared from the above resin composition, which is prepared by impregnating a substrate with the above resin composition or by coating the above resin composition onto a substrate and then drying the impregnated or coated substrate. Methods of impregnating or coating the resin composition include, but are not limited to, impregnation, roll coating, die coating, rod coating, gravure coating, spin coating, slit coating, and spraying. The impregnated or coated substrate may be dried at a temperature of 80° C. to 180° C. for 1 to 30 minutes to obtain a prepreg in a semi-cured state (B-stage). In the attached embodiments, the drying was carried out at 90° C. for 30 minutes.

Commonly used substrates include, but are not limited to, paper, cloth or felt made of materials selected from the group consisting of: paper fiber, glass fiber, quartz fiber, organic polymer fiber, carbon fiber, and combinations thereof. Examples of organic polymer fibers include, but are not limited to, high-modulus polypropylene (HMPP) fibers, polyamide fibers, ultra-high molecular weight polyethylene (UHMWPE) fibers, and liquid crystal polymers (LCP). In some embodiments of the present invention, glass fiber cloth was used as the substrate.

5. Metal-Clad Laminate and Printed Circuit Board

The present invention also provides a metal-clad laminate made from the prepreg describe above, which comprises a composite layer and a metal layer, wherein the composite layer is provided by the prepreg described above. Specifically, the metal-clad laminate of the present invention may be prepared by the following way: using one layer of prepreg or a plurality of layers of laminated prepregs as a composite layer, then laminating a metal foil (e.g., copper foil) on at least one outer surface of the composite layer to provide a laminate including the composite layer and the metal layer, and hot pressing the laminate to obtain the metal-clad laminate. The conditions of hot pressing operation may be as follows: hot pressing for 60 to 200 minutes at a temperature of 180° C. to 220° C. and a pressure of 5 to 30 kg/cm$^2$.

The metal foil at the outside of the metal-clad laminate described above may be further patterned to form a printed circuit board.

6. Examples

6.1. Description of Measurement Method

The present invention will be further illustrated by the following specific embodiments, in which the adopted measuring instruments and methods are respectively as follows:

[FT-IR Spectrum Measurement]

The allyl-containing resin prepared was extracted with an organic solvent and water to obtain an organic layer, and then the organic solvent was completely removed by vacuum concentration to obtain the allyl-containing resin sample to be analyzed.

1 mg of allyl-containing resin sample was coated on a KBr pellet with a diameter of 13 mm and a thickness of 0.5 mm to form a film with a thickness of 0.02 μm by a film method, the coated KBr pellet was placed in a pellet holder and then placed in a Fourier transform infrared spectrometer (Model: Spotlight 200i; manufacturer: PerkinElmer), and the absorption spectrum of the coated KBr pellet was measured under the following conditions: a scan count of 16, a scan range of 4000 cm$^{-1}$ to 400 cm$^{-1}$, and a resolution of 1 cm$^1$, and the signal intensity a and signal intensity b were determined using attenuated total reflectance (ATR), wherein the signal intensities are the absorbance values (arbitrary units) within the respective designated wavelength ranges, and each of them is calculated from the integral area of the connecting line between the starting point and the ending point of the peak in each designated range.

[$^1$H-NMR Spectrum Measurement]

The allyl-containing resin prepared was extracted with an organic solvent and water to obtain an organic layer, and then the organic solvent was completely removed by vacuum concentration to obtain the allyl-containing resin sample to be analyzed.

15 mg of allyl-containing resin sample was dissolved in 750 μl of deuterated chloroform (CDCl$_3$), the resultant solution was placed in a sample feeder of the nuclear magnetic resonance spectrometer (Model: Bruker AVANCE 500 NMR), and after a shimming step, analysis was performed using a 5 mm probe (probe type: BBFO Smart probe), in which tetramethylsilane was used as a reference material, the resonance frequency was 500 MHz, the pulse width was 10 μs, the pulse delay time was 2 seconds, the number of scans was 32, and the chemical shift of the reference material was set to 0 ppm.

[Glass Transition Temperature ($T_g$) Test]

A differential scanning calorimeter (DSC) was used to measure the glass transition temperature (Tg) of the sample. The test determination for the $T_g$ used IPC-TM-650.2.4.25 test method of the Institute for Interconnection and Packaging Electronic Circuits (IPC).

[Dielectric Constant ($D_k$) and Dielectric Dissipation Factor ($D_f$) Test]

According to IPC-TM-650 2.5.5.13 specification, the dielectric constant ($D_k$) and the dielectric dissipation factor ($D_f$) of the sample to be tested were measured by a microwave induced analyzer (purchased from AET Company, Japan) at 25° C. at a working frequency of 10 GHz.

6.2. Preparation of Allyl-Containing Resin

Example 1

A 1-liter glass reaction kettle with 4-neck frosted ports, including a temperature control equipment, a stirring blade and a heating equipment was obtained, and 230 g of phenol bridging resin (Model: PF9110; purchased from Changchun Artificial Resin Factory Co., Ltd., Taiwan), and 300 g of allyl acetate were added into the kettle. Then, the resultant mixture was stirred and heated to 80° C., then 0.06 g of palladium(II) acetate ((Pd)OAc$_2$) and 0.3 g of triphenyl phosphine (TPP) were added and stirred for 0.5 h, 180 ml of 50% potassium carbonate solution was added with a glass dropper and left to react for 3 hours, and then 284 g of allyl-containing resin A was obtained. The allyl-containing resin A had terminal hydroxyl groups and repeating units comprising the first structural unit represented by the formula (I), wherein R$_1$ was allyl, R$_2$ was H, and R$_3$ was H.

The FT-IR spectrum and $^1$H-NMR spectrum of allyl-containing resin A were measured according to the above method, and the ratio (a/b) of the signal intensity a to the signal intensity b and the ratio (c/d) of the signal intensity c to the signal intensity d were calculated, and the results were recorded in Table 1.

Example 2

A 1-liter glass reaction kettle was obtained, 280 g of allyl-containing resin A prepared from Example 1 was poured into the kettle, nitrogen with a flow rate of 50 ml/min was introduced therein, the resultant mixture was stirred and heated to 190° C. to react for 8 hours, and then 272 g of allyl-containing resin B was obtained. The allyl-containing resin B had terminal hydroxyl groups and repeating units comprising the first structural unit represented by the formula (I), wherein R$_1$ was H, R$_2$ was allyl, and R$_3$ was H.

The FT-IR spectrum and $^1$H-NMR spectrum of allyl-containing resin B were measured according to the above methods, and the ratio (a/b) of the signal intensity a to the signal intensity b and the ratio (c/d) of the signal intensity c to the signal intensity d were calculated, and the results were recorded in Table 1.

Example 3

A 3-liter high-pressure reaction kettle was obtained, 225 g of para-tert-butyl phenol, 130 g of dicyclopentadiene and 2 g of Lewis acid catalyst ($AlCl_3$) were added into the kettle, the resultant mixture was stirred and heated to 150° C., the temperature was maintained for 3 hours, and then the temperature was raised to 180° C. and the unreacted materials were removed under reduced pressure. Then, 1350 g of ethanol, 350 g of allyl chloride and 140 g of potassium carbonate were added, the resultant mixture was stirred and heated to 100° C. to react for 10 hours, and then 144 g of allyl-containing resin C was obtained. The allyl-containing resin C had terminal hydroxyl groups and repeating units comprising the first structural unit represented by the formula (I), wherein $R_1$ was allyl, $R_2$ was H, and $R_3$ was tert-butyl.

The FT-IR spectrum and $^1$H-NMR spectrum of allyl-containing resin C were measured according to the above methods, and the ratio (a/b) of the signal intensity a to the signal intensity b and the ratio (c/d) of the signal intensity c to the signal intensity d were calculated, and the results were recorded in Table 1.

Example 4

A 1-liter glass reaction kettle was obtained, 130 g of allyl-containing resin C prepared from Example 3 was poured into the kettle, nitrogen with a flow rate of 130 ml/min was introduced therein, the resultant mixture was stirred and heated to 195° C. to react for 5 hours continuously, and then 128 g of allyl-containing resin D was obtained. The allyl-containing resin D had terminal hydroxyl groups and repeating units comprising the first structural unit represented by the formula (I), wherein $R_1$ was H, $R_2$ was allyl, and $R_3$ was tert-butyl.

The FT-IR spectrum and $^1$H-NMR spectrum of allyl-containing resin D were measured according to the above methods, and the ratio (a/b) of the signal intensity a to the signal intensity b and the ratio (c/d) of the signal intensity c to the signal intensity d were calculated, and the results were recorded in Table 1.

Example 5

A 3-liter high-pressure reaction kettle was obtained, 300 g of Cardanol, 130 g of dicyclopentadiene and 2 g of Lewis acid catalyst ($AlCl_3$) were added into the kettle, the resultant mixture was stirred and heated to 135° C., and the temperature was maintained for 4 hours. Then, 1500 g of ethanol, 339 g of allyl chloride and 163 g of potassium carbonate were added, the resultant mixture was stirred and heated to 80° C. to react for 6 hours, and then 137 g of allyl-containing resin E was obtained. The allyl-containing resin E had terminal hydroxyl groups and repeating units comprising the first structural unit represented by the formula (I), wherein $R_1$ was allyl, $R_2$ was H, and $R_3$ was —$C_{15}H_{27}$.

The FT-IR spectrum and $^1$H-NMR spectrum of allyl-containing resin E were measured according to the above methods, and the ratio (a/b) of the signal intensity a to the signal intensity b and the ratio (c/d) of the signal intensity c to the signal intensity d were calculated, and the results were recorded in Table 1.

Example 6

A 1-liter glass reaction kettle was obtained, 120 g of allyl-containing resin E prepared from Example 5 were poured into the kettle, the resultant mixture was stirred and heated to 194° C. under a pressure of 10 torr to react for 4.5 hours, and then 106 g of allyl-containing resin F was obtained. The allyl-containing resin F had terminal hydroxyl groups and repeating units comprising the first structural unit represented by the formula (I), wherein $R_1$ was H, $R_2$ was allyl, and $R_3$ was —$C_{15}H_{27}$.

The FT-IR spectrum and $^1$H-NMR spectrum of allyl-containing resin F were measured according to the above methods, and the ratio (a/b) of the signal intensity a to the signal intensity b and the ratio (c/d) of the signal intensity c to the signal intensity d were calculated, and the results were recorded in Table 1.

Comparative Example 1

A 2-liter glass reaction kettle with 4-neck frosted ports, including a temperature control equipment, a stirring blade and a heating equipment was obtained. 115 g of bisphenol A (BPA; purchased from Changchun Artificial Resin Factory Co., Ltd., Taiwan), and 200 g of allyl acetate were added into the kettle. Then, the resultant mixture was stirred and heated to 82° C., and 0.048 g of palladium(II) acetate (($Pd)OAc_2$) and 0.3 g of triphenyl phosphine (TPP) were added. Next, 165 ml of 50% potassium carbonate solution was added with a glass dropper and left to react for 4 hours continuously, and 150 g of comparative allyl-containing resin G was obtained. The comparative allyl-containing resin G had terminal hydroxyl groups and repeating units comprising the first structural unit represented by the formula (I), wherein $R_1$ was allyl, $R_2$ was H, and $R_3$ was H.

The FT-IR spectrum and $^1$H-NMR spectrum of comparative allyl-containing resin G were measured according to the above methods, and the ratio (a/b) of the signal intensity a to the signal intensity b and the ratio (c/d) of the signal intensity c to the signal intensity d were calculated, and the results were recorded in Table 1.

Comparative Example 2

A 1-liter glass reaction kettle was obtained, 114 g of diallyl ether bisphenol A (Homide 126A; purchased from Hos-Technik Company, Austria) was poured into the kettle, nitrogen with a flow rate of 65 ml/min was introduced therein, the resultant mixture was stirred and heated to 195° C. to react for 12 hours, and then 107 g of comparative allyl-containing resin H was obtained. The comparative allyl-containing resin H had terminal hydroxyl groups and repeating units comprising the first structural unit represented by the formula (I), wherein $R_1$ was H, $R_2$ was allyl, and $R_3$ was H.

The FT-IR spectrum and $^1$H-NMR spectrum of comparative allyl-containing resin H were measured according to the above methods, and the ratio (a/b) of the signal intensity a to the signal intensity b and the ratio (c/d) of the signal intensity c to the signal intensity d were calculated, and the results were recorded in Table 1.

Comparative Example 3

A 3-liter high-pressure reaction kettle was obtained, 120 g of OCN88 (purchased from Changchun Artificial Resin Factory Co., Ltd., Taiwan), 1350 g of ethanol, 350 g of allyl chloride and 140 g of potassium carbonate were added into the kettle, the resultant mixture was stirred and heated to 100° C. to react for 12 hours, and then 172 g of comparative allyl-containing resin I was obtained. The comparative allyl-containing resin I had terminal hydroxyl groups and repeating units comprising the first structural unit represented by the formula (I), wherein $R_1$ was allyl, $R_2$ was H, and $R_3$ was H.

The FT-IR spectrum and $^1$H-NMR spectrum of comparative allyl-containing resin I were measured according to the above methods, and the ratio (a/b) of the signal intensity a to the signal intensity b and the ratio (c/d) of the signal intensity c to the signal intensity d were calculated, and the results were recorded in Table 1.

Comparative Example 4

A 1-liter glass reaction kettle was obtained, 134 g of comparative allyl-containing resin I prepared from Comparative Example 3 was poured into the kettle, nitrogen with a flow rate of 100 ml/min was introduced therein, the resultant mixture was stirred and heated to 200° C. to react for 5 hours continuously, and then 126 g of comparative allyl-containing resin J was obtained. The comparative allyl-containing resin J had terminal hydroxyl groups and repeating units comprising the first structural unit represented by the formula (I), wherein R was H, $R_2$ was allyl, and $R_3$ was H.

The FT-IR spectrum and $^1$H-NMR spectrum of comparative allyl-containing resin J were measured according to the above methods, and the ratio (a/b) of the signal intensity a to the signal intensity b and the ratio (c/d) of the signal intensity c to the signal intensity d were calculated, and the results were recorded in Table 1.

TABLE 1

| Examples/Comparative Examples | Allyl-containing resin | a/b | c/d |
|---|---|---|---|
| Example 1 | Allyl-containing resin A | 0.78 | 0.93 |
| Example 2 | Allyl-containing resin B | 0.19 | 0.93 |
| Example 3 | Allyl-containing resin C | 0.75 | 1.15 |
| Example 4 | Allyl-containing resin D | 0.95 | 1.07 |
| Example 5 | Allyl-containing resin E | 1.18 | 0.94 |
| Example 6 | Allyl-containing resin F | 1.06 | 1.02 |
| Comparative Example 1 | Comparative allyl-containing resin G | 0.16 | 1.24 |
| Comparative Example 2 | Comparative allyl-containing resin H | 1.98 | 2.08 |
| Comparative Example 3 | Comparative allyl-containing resin I | 1.1 | 2.49 |
| Comparative Example 4 | Comparative allyl-containing resin J | 1.26 | 2.22 |

As shown in Table 1, the allyl-containing resin A to F of the present invention are all characterized by 0<a/b≤1.20 and 0<c/d≤1.20. In contrast, the comparative allyl-containing resin G to J of the comparative examples are not characterized by 0<a/b≤1.20 and 0<c/d≤1.20.

6.3. Heat Resistance Analysis on Modified Bismaleimide Resin

Heat resistance analysis was performed on bismaleimide resin (BMI-70; purchased from KI Chemistry) modified with allyl-containing resin of Examples 1 to 2 and Comparative Examples 1 to 2 respectively. First, the allyl-containing resin and bismaleimide resin were mixed according to the ratio shown in Table 2 and kept at a temperature of 50° C., then the temperature was raised to 160° C. at a rate of 10° C. per minute and maintained for 1 hour, then the temperature was raised to 180° C. at a rate of 10° C. per minute and maintained for 3 hours, and then the temperature was raised to 300° C. at a rate of 10° C. per minute and maintained for 5 hours. Finally, the resultant product was cooled to 50° C. at a rate of 10° C. per minute, thereby obtaining a thermo-crosslinking cured product of the bismaleimide resin modified with allyl-containing resin.

The glass transition temperature ($T_g$) of the cured product was measured according to the measurement method described above, and the results were recorded in Table 2 below.

TABLE 2

| Analysis | Allyl-containing resin (g) | BMI resin (g) | $T_g$ (° C.) |
|---|---|---|---|
| 1 | Allyl-containing resin A (5.88) | BMI-70(7.51) | 252 |
| 2 | Allyl-containing resin B (7.61) | BMI-70(9.72) | 256 |
| 3 | Comparative allyl-containing resin G (4.62) | BMI-70(6.63) | 247 |
| 4 | Comparative allyl-containing resin H (5.94) | BMI-70(7.96) | 252 |

As shown in Table 2, the bismaleimide resin modified with the allyl-containing resin of the present invention still has excellent heat resistance (high $T_g$).

6.4. Dielectric Property Analysis of Modified Bismaleimide Resin

Dielectric property analysis was performed on bismaleimide resin (BMI-70; purchased from KI Chemistry) modified with the allyl-containing resin of Example 1 and Comparative Examples 1 and 3 respectively. First, the allyl-containing resin and bismaleimide resin were mixed in the ratio shown in Table 3 below and reacted at 160° C. for 1 hour to obtain a modified bismaleimide prepolymer. The resultant modified bismaleimide prepolymer and polyimide adhesive (PIAD-200; purchased from Arakawa Chemical Co., Ltd.) were mixed at a weight ratio of 7:3 to provide a resin mixture.

The resultant resin mixture was coated on the surface of a liquid crystal polymer film (Model: CTZ-25; purchased from Kuraray Company) and vacuum hot-pressed with a hot press (Model: VLP-60; purchased from VAQUA Machinery Co., Ltd.) at 200° C. for 1 hour, and then the resultant cured resin was peeled off from the liquid crystal polymer film, and the dielectric properties ($D_k$ and $D_f$) of the cured resin were measured according to the measurement method described above, and the results were recorded in Table 3 below.

TABLE 3

| Analysis | Allyl-containing resin (g) | BMI resin (g) | Polyimide adhesive (g) | $D_k$@10 GHz | $D_f$@10 GHz |
|---|---|---|---|---|---|
| 1 | Allyl-containing resin A(3.46) | BMI-70 (4.42) | PIAD-200(3.38) | 2.8574 | 0.0110 |
| 2 | Comparative allyl-containing resin G(3.08) | BMI-70 (4.42) | PIAD-200(3.21) | 3.0241 | 0.0130 |
| 3 | Comparative allyl-containing resin I(3.30) | BMI-70 (4.42) | PIAD-200(3.31) | 3.0967 | 0.0118 |

As shown in Table 3, the bismaleimide resin modified by the allyl-containing resin of the present invention may also have better dielectric properties, especially a lower $D_f$ value, making it especially suitable for high-frequency applications.

6.4. Analysis of Properties of Modified Polyphenylene Ether Resin Composition Dielectric property analysis was performed on the polyphenylene ether resin composition modified with allyl-containing resin of Examples 1 to 6 and Comparative Examples 1 to 4 respectively. First, allyl-containing resin and bismaleimide resin were mixed in the ratio shown in Table 4 below and reacted at 250° C. for 3 hours to provide a modified bismaleimide prepolymer.

The resultant modified bismaleimide prepolymer was prepared into methyl ethyl ketone solution with a solid content of 70 wt %, and polyphenylene ether resin (SA9000; purchased from Saudi Basic Industries) and a polymerization initiator (Dicumyl peroxide) were added according to the ratio shown in Table 4 to provide a polyphenylene ether resin composition.

The metal-clad laminate was prepared by using the prepared polyphenylene ether resin composition. First, glass fiber cloth (Model: 2116; purchased from Glass Industry Co., Ltd., Taiwan) was coated with polyphenylene ether resin composition with a roller, and the coated glass fiber cloth was heated and dried in a dryer at 90° C. for 30 minutes, thereby producing a prepreg in a B-stage. Thereafter, four prepregs were laminated, and a PLS electrolytic copper foil (purchased from Changchun Petrochemical Co., Ltd., Taiwan) was laminated on the outermost layers of both sides, and then the resultant product was placed in a hot press for high-temperature hot-pressing curing to prepare a metal-clad laminate. The hot pressing conditions were as follows: heating to 180° C. at a heating rate of 2.5° C./min, and hot pressing at that temperature for 60 minutes at a total pressure of 20 to 30 kg/cm².

The heat resistance and dielectric properties ($D_k$ and $D_f$) of the obtained metal-clad laminates were measured according to the measurement method described above, and the results were recorded in Table 4 below.

TABLE 4

| Analysis | Allyl-containing resin (g) | BMI resin (g) | Polyphenylene ether resin(g) | Polymerization initiator(g) | $T_g$ (° C.) | $D_k$@10 GHz | $D_f$@10 GHz |
|---|---|---|---|---|---|---|---|
| 1 | Allyl-containing resin A (43.25) | BMI-70 (55.28) | SA-9000 (110.75) | Dicumyl peroxide (4.18) | 252 | 3.43 | 0.0026 |
| 2 | Allyl-containing resin B (34.69) | BMI-70 (44.27) | SA-9000 (88.53) | Dicumyl peroxide (3.35) | 256 | 3.45 | 0.0029 |
| 3 | Allyl-containing resin C (57.50) | BMI-70 (55.34) | SA-9000 (112.69) | Dicumyl peroxide (4.11) | 232 | 3.44 | 0.0028 |
| 4 | Allyl-containing resin D (63.25) | BMI-70 (61.02) | SA-9000 (124.17) | Dicumyl peroxide (4.52) | 238 | 3.44 | 0.0031 |
| 5 | Allyl-containing resin E (95.22) | BMI-70 (55.68) | SA-9000 (109.51) | Dicumyl peroxide (4.06) | 217 | 3.51 | 0.0032 |
| 6 | Allyl-containing resin F (94.84) | BMI-70 (55.11) | SA-9000 (111.76) | Dicumyl peroxide (4.25) | 225 | 3.53 | 0.0033 |
| 7 | Comparative allyl-containing resin G (18.00) | BMI-70 (25.86) | SA-9000 (51.73) | Dicumyl peroxide (1.91) | 243 | 3.56 | 0.0043 |
| 8 | Comparative allyl-containing resin H (23.76) | BMI-70 (34.13) | SA-9000 (68.26) | Dicumyl peroxide (2.52) | 247 | 3.94 | 0.0052 |
| 9 | Comparative allyl-containing resin I (55.00) | BMI-70 (73.67) | SA-9000 (147.34) | Dicumyl peroxide (5.52) | 251 | 3.49 | 0.0041 |
| 10 | Comparative allyl-containing resin J (46.75) | BMI-70 (62.62) | SA-9000 (125.25) | Dicumyl peroxide (4.69) | 252 | 3.77 | 0.0049 |

As shown in Table 4, the cured product of polyphenylene ether resin modified with allyl-containing resin of the present invention not only has good heat resistance, but also has excellent dielectric properties, especially a lower $D_f$ value ($\leq 0.0035$), so it is especially suitable as a dielectric material for high-frequency printed circuit boards.

The above examples are used to illustrate the principle and efficacy of the present invention and show the inventive features thereof, but are not intended to limit the scope of the present invention. Modifications, variations, and substantial equivalents can be made by those skilled in the art without departing from the principle and spirit of the present invention. Accordingly, all such modifications, variations, and substantial equivalents are within the scope of the present invention as defined in the claims as appended.

What is claimed is:

1. An allyl-containing resin, which comprises a repeating unit comprising a first structural unit represented by the following formula (I):

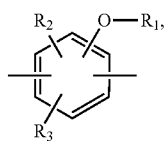

[formula (I)]

wherein, $R_1$ and $R_2$ are independently H or allyl, with the proviso that at least one of $R_1$ and $R_2$ is allyl; and $R_3$ is H or a $C_1$ to $C_{21}$ hydrocarbyl;

the Fourier transform infrared spectrum of the allyl-containing resin has a signal intensity a ranging from 1650 $cm^{-1}$ to 1630 $cm^{-1}$ and a signal intensity b ranging from 1620 $cm^{-1}$ to 1560 $cm^{-1}$, and $0 < a/b \leq 1.20$; and the quantitative $^1$H-NMR spectrum of the allyl-containing resin has a signal intensity c ranging from 3.2 ppm to 6.2 ppm and a signal intensity d ranging from 6.6 ppm to 7.4 ppm, and $0 < c/d \leq 1.20$.

2. The allyl-containing resin of claim 1, wherein the Fourier transform infrared spectrum is determined as follows:

coating the allyl-containing resin on a KBr pellet using a film method; and characterizing the absorption spectrum of the KBr pellet by using a Fourier transform infrared spectrometer under the following conditions: a scan count of 16, a scan range of 4000 $cm^{-1}$ to 400 $cm^{-1}$, and a resolution of 1 $cm^{-1}$; and determining the signal intensity a and signal intensity b using attenuated total reflectance, wherein the signal intensities are the absorbance values within the respective designated wavelength ranges.

3. The allyl-containing resin of claim 1, wherein the quantitative 1H-NMR spectrum is determined by a nuclear magnetic resonance spectrometer by using deuterated chloroform as a solvent and tetramethylsilane as a reference material under the following conditions: a resonance frequency of 500 MHz, a pulse width of 10 μs, a pulse delay of 2 s, a scan count of 32, and a chemical shift of the reference material of 0 ppm.

4. The allyl-containing resin of claim 1, wherein $0.10 \leq a/b \leq 1.20$ and $0.50 \leq c/d \leq 1.20$.

5. The allyl-containing resin of claim 1, wherein the repeating unit further comprises one or more second structural units selected from the group consisting of —$CH_2$—, —$C_2H_4$—, —$C_2H_2$—, —$C_2$—, —$C_3H_6$—, —$C_3H_4$—, —$C_3H_2$—, —$C_4H_8$—, —$C_4H_6$—, —$C_4H_4$—, —$C_5H_{10}$—, —$C_5H_8$—, —$C_5H_6$—, —$C_6H_{12}$—, —$C_6H_{10}$—, —$C_6H_8$—, —$C_7H_{14}$—, —$C_7H_{12}$—, —$C_7H_{10}$—, —$C_8H_{16}$—, —$C_8H_{14}$—, —$C_8H_{12}$—, —$C_9H_{18}$—, —$C_9H_{16}$—, —$C_9H_{14}$—, —$C_{10}H_{120}$—, —$C_{10}H_{18}$—, —$C_{10}H_{16}$—,

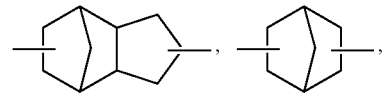

carbonyl, sulfuryl, and —O—.

6. A bismaleimide resin, which is modified by the allyl-containing resin of claim 1.

7. A resin composition, which comprises the bismaleimide resin of claim 6.

8. A prepreg, which is prepared by impregnating a substrate with the resin composition of claim 7 or by coating the resin composition of claim 7 onto a substrate, and drying the impregnated or coated substrate.

9. A metal-clad laminate, which is prepared by laminating the prepreg of claim 8 with a metal foil.

10. A printed circuit board, which is prepared from the metal-clad laminate of claim 9.

* * * * *